(12) United States Patent
Mun

(10) Patent No.: US 12,380,951 B2
(45) Date of Patent: Aug. 5, 2025

(54) MEMORY DEVICE AND OPERATING METHOD THEREOF

(71) Applicant: SK hynix Inc., Icheon-si (KR)

(72) Inventor: Yeong Jo Mun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 176 days.

(21) Appl. No.: 18/300,294

(22) Filed: Apr. 13, 2023

(65) Prior Publication Data

US 2024/0170068 A1 May 23, 2024

(30) Foreign Application Priority Data

Nov. 18, 2022 (KR) ........................ 10-2022-0155527

(51) Int. Cl.
| | |
|---|---|
| *G11C 16/10* | (2006.01) |
| *G11C 16/04* | (2006.01) |
| *G11C 16/08* | (2006.01) |
| *G11C 16/24* | (2006.01) |
| *G11C 29/50* | (2006.01) |
| *H10B 41/27* | (2023.01) |
| *H10B 43/27* | (2023.01) |

(52) U.S. Cl.
CPC .......... *G11C 16/10* (2013.01); *G11C 16/0483* (2013.01); *G11C 16/08* (2013.01); *G11C 16/24* (2013.01); *G11C 29/50004* (2013.01); *H10B 41/27* (2023.02); *H10B 43/27* (2023.02)

(58) Field of Classification Search
CPC ..... G11C 16/10; G11C 16/0483; G11C 16/08; G11C 16/24; G11C 29/50004; H10B 41/27; H10B 43/27
USPC ..................................... 365/185.23
See application file for complete search history.

(56) References Cited

U.S. PATENT DOCUMENTS

2021/0193225 A1* 6/2021 Park .................... G06F 11/0754
2021/0304810 A1* 9/2021 Lee ........................ G11C 16/08

FOREIGN PATENT DOCUMENTS

| KR | 1020130049332 A | 5/2013 |
|---|---|---|
| KR | 102039431 B1 | 11/2019 |

* cited by examiner

*Primary Examiner* — Amir Zarabian
*Assistant Examiner* — Daniel John King
(74) *Attorney, Agent, or Firm* — WILLIAM PARK & ASSOCIATES LTD.

(57) ABSTRACT

A memory device includes a memory cell array including a first memory cell connected to a first channel structure, and a second memory cell connected to a second channel structure; a peripheral circuit for performing a program operation of storing data in the first and second memory cells commonly connected to a word line; and a program operation controller for controlling the peripheral circuit to perform the program operation, the program operation including an intermediate program operation performed on the first memory cell and then on the second memory cell, and a final program operation preformed to have a threshold voltage of the first and second memory cells to a threshold voltage corresponding to a target program state.

20 Claims, 12 Drawing Sheets

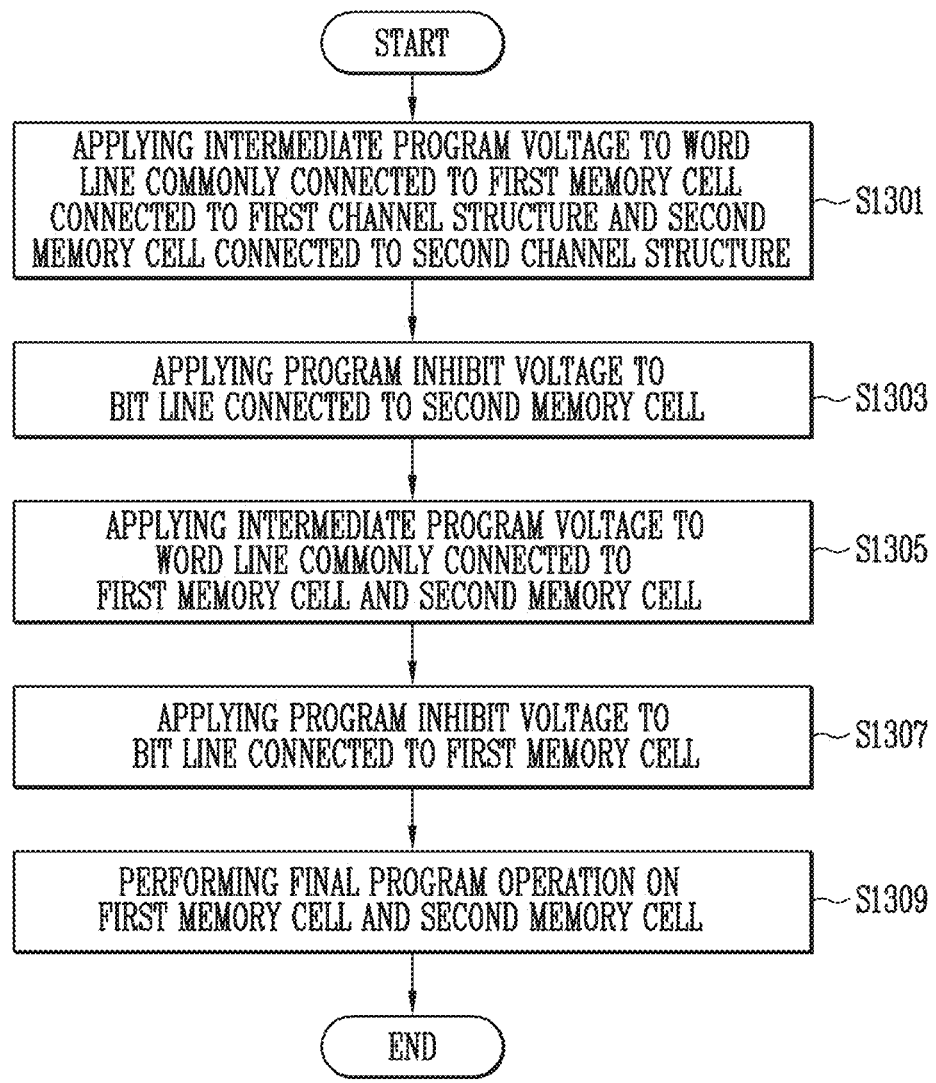

MEMORY DEVICE AND OPERATING METHOD THEREOF

CROSS-REFERENCE TO RELATED APPLICATION

The present application claims priority under 35 U.S.C. § 119(a) to Korean patent application number 10-2022-0155527 filed on Nov. 18, 2022, in the Korean Intellectual Property Office, the entire disclosure of which is incorporated by reference herein.

BACKGROUND

1. Technical Field

The present disclosure generally relates to an electronic device, and more particularly, to a memory device and an operating method thereof.

2. Related Art

A memory system is a device that stores data under the control of a host device, such as a computer or a smart phone. The memory system may include a memory device for storing data and a memory controller for controlling the memory device. The memory device is classified into a volatile memory device and a nonvolatile memory device.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

The memory device may be configured with a plurality of pillar structures. Each pillar structure may penetrate a gate structure in which a conductive layer and an insulating layer are alternately stacked. A memory cell may be located at a position at which the pillar structure and the conductive layer intersect each other. Memory cells included in one pillar structure form one channel region. The pillar structure needs to be improved to increase the degree of integration of memory cells in a three-dimensionally configured memory device.

SUMMARY

In accordance with an aspect of the present disclosure, there is provided a memory device including: a memory cell array including a gate stack structure in which conductive layers and insulating layers are alternately stacked, a first channel structure and a second channel structure, which vertically penetrate the gate stack structure and are isolated from each other by a cutting structure, a first memory cell connected to the first channel structure, and a second memory cell connected to the second channel structure; a peripheral circuit configured to perform a program operation of storing data in the first and second memory cells commonly connected to a word line; and a program operation controller configured to control the peripheral circuit to perform the program operation, the program operation including an intermediate program operation performed on the first memory cell and then on the second memory cell, and a final program operation performed to increase a threshold voltage of the first and second memory cells to a threshold voltage corresponding to a target program state, wherein the intermediate program operation is performed to increase the threshold voltage of the first and second memory cells to a threshold voltage corresponding to any one of an erase state and an intermediate state.

In accordance with another aspect of the present disclosure, there is provided a method of operating a memory device, the method including: performing an intermediate program operation on a first memory cell connected to a first channel structure selected from the first channel structure and a second channel structure, which vertically penetrate a gate stack structure and are isolated from each other by a cutting structure, wherein the gate stack structure includes conductive layers and insulating layers that are alternately stacked; performing the intermediate program operation on a second memory cell that is connected to the second channel structure and is commonly connected to a word line connected to the first memory cell; and performing a final program operation to increase a threshold voltage of the first and second memory cells to a threshold voltage corresponding to a target program state, wherein the intermediate program operation is performed to increase the threshold voltage of the first and second memory cells to a threshold voltage corresponding to any one of an erase state and an intermediate state.

In accordance with still another aspect of the present disclosure, there is provided a memory device including: a memory cell array including a pillar structure including a first memory cell included in a first channel region vertically formed on a substrate and a second memory cell included in a second channel region formed in parallel to the first channel region; an address decoder configured to perform an intermediate program operation of providing a first intermediate program voltage to a word line commonly connected to the first memory cell and the second memory cell and then providing a second intermediate program voltage to the word line and configured to perform a final program operation of providing a program voltage to the word line; and a page buffer configured to provide voltages associated with precharge to bit lines respectively connected to the first and second memory cells, wherein, when each of the first and second intermediate program voltages is provided to the word line, a first precharge voltage provided to a bit line connected to the first memory cell and a second precharge voltage provided to a bit line connected to the second memory cell have different magnitudes.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 12 is a flowchart illustrating a program operation of the memory device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a memory device and an operating method thereof, which can reduce a phenomenon in which a threshold voltage of adjacent memory cells is changed in a program operation.

Figure 1:
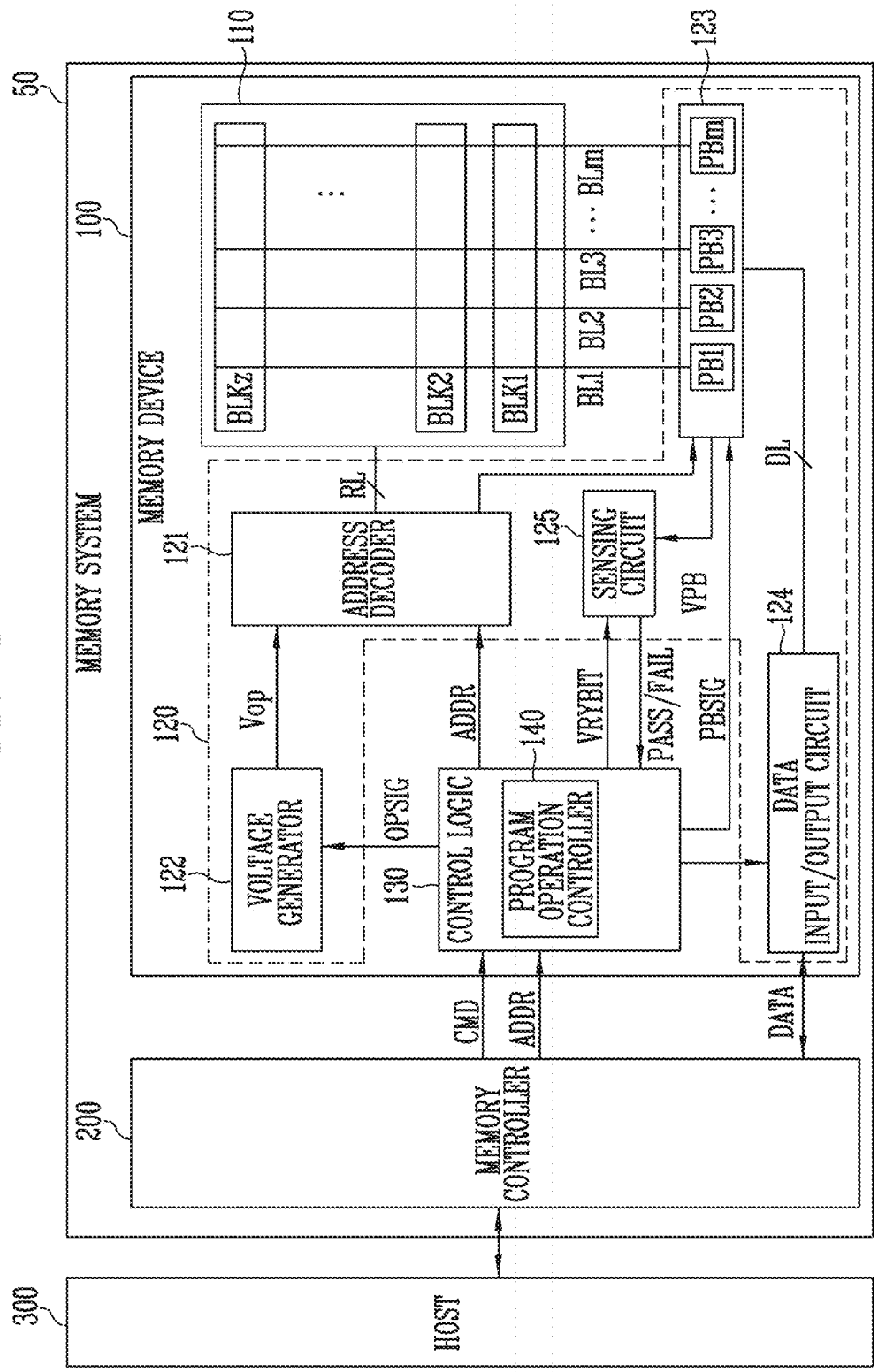
FIG. 1 is a diagram illustrating a memory system including a memory device in accordance with an embodiment of the present disclosure.

FIG. 1 is a diagram illustrating a memory system including a memory device in accordance with an embodiment of the present disclosure.

Referring to FIG. 1, the memory system 50 may include a memory device 100 and a memory controller 200. The memory system 50 may be a device for storing data under the control of a host 300, such as a mobile phone, a computer, or an in-vehicle infotainment system.

The memory system 50 may be manufactured as any one of various types of storage devices, such as a Solid State Drive (SDD) and a Universal Flash Storage (UFS), according to a host interface as a communication scheme with the host 300.

The memory system 50 may be manufactured as any one of various kinds of package types, such as a System On Chip (SOC).

The memory device 100 may store data. The memory device 100 may operate under the control of the memory controller 200.

In an embodiment, the memory device 100 may be a nonvolatile memory device or a volatile memory device.

The memory device 100 may receive a command CMD and an address ADDR from the memory controller 200 and may access an area selected by the address ADDR in the memory cell array. The memory device 100 may perform an operation based on the command CMD on the area selected by the address ADDR. The memory device 100 may program, read, or erase data in the area selected by the address ADDR.

In an embodiment, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be connected to an address decoder 121 through row lines RL. The plurality of memory blocks BLK1 to BLKz may be connected to a page buffer group 123 through bit lines BL1 to BLm. Each of the plurality of memory blocks BLK1 to BLKz may include a plurality of memory cells. In an embodiment, the plurality of memory cells may be nonvolatile memory cells. Memory cells connected to the same word line among the plurality of memory cells may be defined as one page. That is, the memory cell array 110 may be configured with a plurality of physical pages. In an embodiment, a page may be a unit for storing data or reading stored data. A memory block may be a unit for erasing data.

Each of the memory cells of the memory device 100 may be configured as a Single Level Cell (SLC) storing one-bit data, a Multi-Level Cell (MLC) storing two-bit data, a Triple Level Cell (TLC) storing three-bit data, a Quad Level Cell (QLC) storing four-bit data, or memory cells storing five-or-more-bit data.

The peripheral circuit 120 may drive the memory cell array 110. For example, the peripheral circuit 120 may drive the memory cell array 110 to perform a program operation, a read operation, and an erase operation under the control of the control logic 130. In another example, the peripheral circuit 120 may apply various operating voltages to the row lines RL and the bit lines BL1 to BLm or may discharge the applied voltages under the control of the control logic 130.

The peripheral circuit 120 may include the address decoder 121, a voltage generator 122, the page buffer group 123, a data input/output circuit 124, and a sensing circuit 125.

The address decoder 121 may be connected to the memory cell array 110 through the row lines RL. The row lines RL may include drain select lines, word lines, source select lines, and a source line.

The address decoder 121 may be operated under the control of the control logic 130. The address decoder 121 may receive an address ADDR from the control logic 130.

The address decoder 121 may decode a block address in the received address ADDR. The address decoder 121 may select at least one memory block, among the memory blocks BLK1 to BLKz, according to the decoded block address. The address decoder 121 may decode a row address in the received address ADDR. The address decoder 121 may select at least one word line WL of the selected memory block by applying voltages provided from the voltage generator 122 to the at least one word line WL according to the decoded row address.

In a program operation, the address decoder 121 may apply a program voltage to the selected word line and may apply a pass voltage having a lower level than the program voltage to unselected word lines. In a program verify operation, the address decoder 121 may apply a verify voltage to the selected word line and may apply a verify pass voltage having a higher level than the verify voltage to the unselected word lines.

The address decoder 121 may decode a column address in the received address ADDR. The decoded column address may be transferred to the page buffer group 123. Exemplarily, the address decoder 121 may include components, such as a row decoder, a column decoder, and an address buffer.

The voltage generator 122 may generate a plurality of operating voltages Vop by using an external power voltage supplied to the memory device 100. The voltage generator 122 may be operated under the control of the control logic 130.

In an embodiment, the voltage generator 122 may generate various operating voltages Vop used for program, read, and erase operations in response to an operation signal OPSIG. The voltage generator 122 may generate a plurality of operating voltages Vop by using an external power voltage or an internal power voltage. For example, the voltage generator 122 may generate a plurality of erase voltages, a plurality of program voltages, a plurality of pass voltages, a plurality of select read voltages, and a plurality of unselect read voltages.

The plurality of generated operating voltages Vop may be supplied to the memory cell array 110 by the address decoder 121.

The page buffer group 123 may include first to mth page buffers PB1 to PBm. The first to mth page buffers PB1 to PBm may be connected to the memory cell array 110 respectively through first to mth bit lines BL1 to BLm. The first to mth page buffers PB1 to PBm may be operated under the control of the control logic 130.

The first to mth page buffers PB1 to PBm may communicate data DATA with the data input/output circuit 124. In a program operation, the first to mth page buffers PB1 to PBm may receive data DATA to be stored through the data input/output circuit 124 and data lines DL.

In a program operation, the first to mth page buffers PB1 to PBm may transfer data DATA received through the data input/output circuit 124 to selected memory cells through the bit lines BL1 to BLm. The selected memory cells may be programmed according to the transferred data DATA. A memory cell connected to a bit line through which a program allow voltage (e.g., a ground voltage) is applied may have an increased threshold voltage. A threshold voltage of a memory cell connected to a bit line through which a program inhibit voltage (e.g., a power voltage) is applied may be maintained. In a verify operation, the first to mth page buffers PB1 to PBm may read data DATA stored in the selected memory cells from the selected memory cells through the bit lines BL1 to BLm. The data input/output circuit 124 may be connected to the first to mth page buffers PB1 to PBm through the data lines DL. The data input/output circuit 124 may be operated under the control of the control logic 130.

The data input/output circuit 124 may include a plurality of input/output buffers (not shown) that receive input data DATA. In a program operation, the data input/output circuit 124 may receive data DATA to be stored from the memory controller 200.

In a read operation or verify operation, the sensing circuit 125 may generate a reference current in response to an allow bit VRYBIT generated by the control logic 130 and may output a pass or fail signal PASS/FAIL to the control logic 130 by comparing a sensing voltage VPB received from the page buffer group 123 with a reference voltage generated by the reference current. For example, the sensing circuit 125 may output the pass signal to the control logic 130 when a magnitude of the sensing voltage VPB is greater than a magnitude of the reference voltage. In another example, the sensing circuit 15 may output the fail signal to the control logic 130 when the magnitude of the sensing voltage VPB is smaller than the magnitude of the reference voltage.

The control logic 130 may be connected to the address decoder 121, the voltage generator 122, the page buffer group 123, the data input/output circuit 124, and the sensing circuit 125. The control logic 130 may control a general operation of the memory device 100. The control logic 130 may be operated in response to a command CMD transferred from the memory controller 200.

The control logic 130 may control the peripheral circuit 120 by generating several signals in response to a command CMD and an address ADDR. For example, the control logic 130 may generate the operation signal OPSIG, the address ADDR, a page buffer control signal PBSIG, and the allow bit VRYBIT in response to the command CMD and the address ADDR. The control logic 130 may output the operation signal OPSIG to the voltage generator 122, output the address ADDR to the address decoder 121, output the page buffer control signal PBSIG to the page buffer group 123, and output the allow bit VRYBIT to the sensing circuit 125. Also, the control logic 130 may determine whether the verify operation has passed or failed in response to the pass or fail signal PASS/FAIL that is output by the sensing circuit 125.

In an embodiment, the control logic 130 may include a program operation controller 140. The program operation controller 140 may control a program operation on memory cells. The program operation may be an operation of storing data in the memory cells. Specifically, the program operation may be an operation of increasing a threshold voltage of the memory cells according to data to be stored in the memory cells. When the program operation is performed, the memory cells may have a threshold voltage corresponding to any one state among a plurality of program states. The plurality of program states may be set according to a number of data bits which one memory cell stores. For example, when one memory cell is programed as a Triple Level Cell (TLC) storing three-bit data, the plurality of program states may mean an erase state and first to seventh program states. A threshold voltage which the memory cells have after the program operation is performed may be determined according to data to be stored in the memory cells. Each of the memory cells may have, as a target program state, any one state among the plurality of program states according to data to be stored therein.

In an embodiment, the program operation may include an intermediate program operation and a final program operation. The intermediate program operation may be an operation of increasing the threshold voltage of the memory cells such that the threshold voltage of the memory cells is a threshold voltage corresponding to any one of the erase operation and an intermediate program state. The intermediate program state may be a program state lower than upper program states among the plurality of program states. For example, when one memory cell is programmed as the TLC, the upper program states may mean the fourth to seventh program states.

The intermediate program operation may include a first intermediate program operation and a second intermediate program operation. The first intermediate program operation may be an operation performed on a first memory cell connected to a first channel structure. The second intermediate program operation may be an operation performed on a second memory cell connected to a second channel structure. The first channel structure and the second channel structure may be channel structures into which one channel structure is isolated by a cutting structure. The first memory cell and the second memory cell may be commonly connected to one word line. The first memory cell and the second memory cell may be memory cells connected to a word line formed by a conductive layer having the same height in a gate stack structure in which conductive layers and insulating layers are alternately stacked.

The final program operation may be an operation of increasing the threshold voltage of the memory cells such that the threshold voltage of the memory cells is a threshold voltage corresponding to a target program state. The final program operation may be an operation performed on the first memory cell connected to the first channel structure and the second memory cell connected to the second channel structure.

The final program operation may include a plurality of program loops. Each program loop may include a program voltage apply operation and a verify operation. The program voltage apply operation may be an operation of increasing the threshold voltage of the memory cells by using a program voltage. The verify operation may be an operation of identifying whether the threshold voltage of the memory cells has reached a threshold voltage corresponding to the target program state by using a verify voltage.

The program operation controller 140 may control the peripheral circuit 120 to perform the intermediate program operation and the final program operation on memory cells. In an embodiment, the program operation controller 140 may control the peripheral circuit 120 to apply word line voltages to a word line connected to the memory cells. In an embodiment, the word line voltages may include an intermediate program voltage used for the intermediate program operation and a plurality of program voltages used for the final program operation. Specifically, the address decoder 121 may provide the word line with an intermediate program voltage and a final program voltage, which are provided from the voltage generator 122.

In an embodiment, the program operation controller 140 may control the peripheral circuit 120 to apply bit line voltages to the bit lines BL1 to BLm respectively connected to the memory cells. In an embodiment, the bit line voltages may include a program allow voltage and a program inhibit voltage. Specifically, the page buffer group 123 may provide the bit lines BL1 to BLm with the bit line voltages generated under the control of the program operation controller 140.

In an embodiment, the program operation controller 140 may control the peripheral circuit 120 to sequentially perform the first intermediate program operation on the first memory cell connected to the first channel structure, the second intermediate program operation on the second memory cell connected to the second channel structure, and the final program operation on the first and second memory cells.

The memory controller 200 may control overall operations of the storage system 50.

The memory controller 200 may control the memory device 100 to perform a write operation, a read operation, an erase operation, or the like according to a request of the host 300. The memory controller 200 may provide a command, a physical address, or data to the memory device 100 according to the write operation, the read operation, or the erase operation.

In an embodiment, the memory controller 200 may autonomously generate a command CMD, an address ADDR, and data DATA, regardless of any request from the host 300, and transmit the command CMD, the address ADDR, and the data DATA to the memory device 100. For example, the memory controller 200 may provide the memory device 100 with a command, an address, and data, which are used to perform read and write operations accompanied in performing wear leveling, read reclaim, garbage collection, or the like.

The host 300 may communicate with the memory system by using at least one of various communication schemes.

Figure 2:
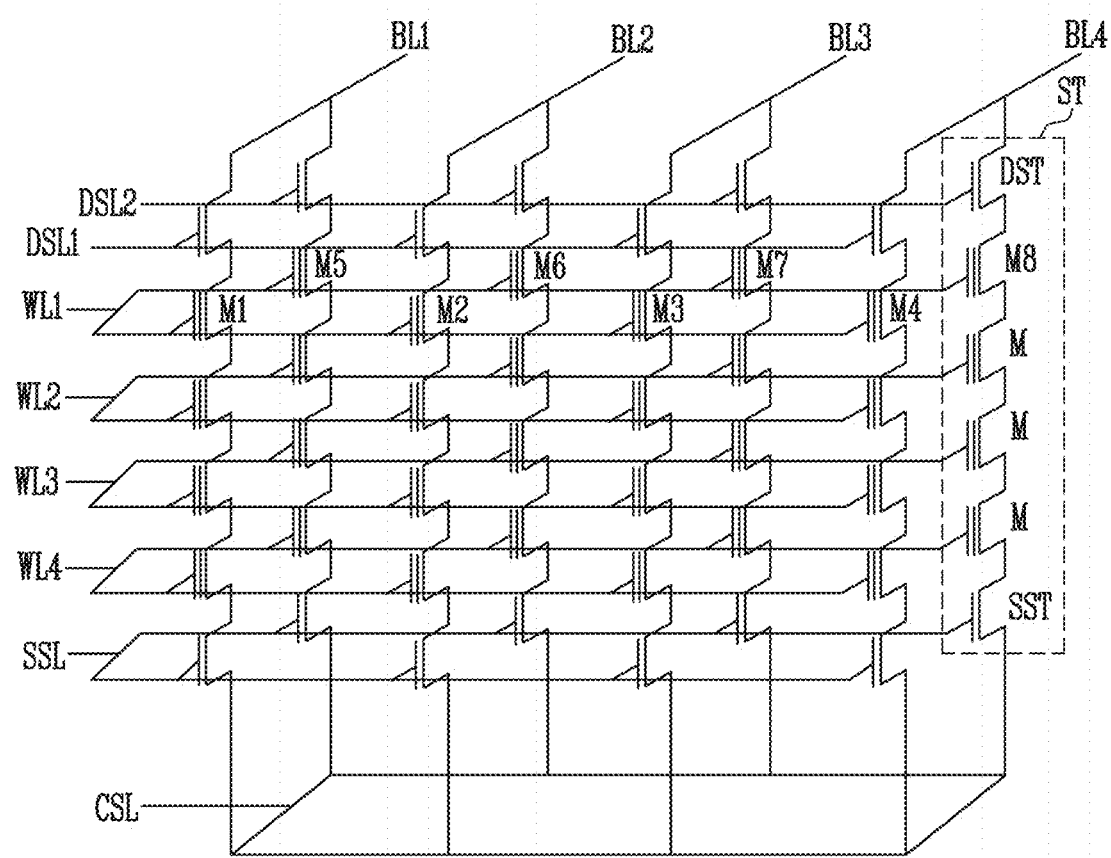
FIG. 2 is a circuit diagram illustrating a memory cell array shown in FIG. 1.

FIG. 2 is a circuit diagram illustrating the memory cell array shown in FIG. 1.

Referring to FIG. 2, the memory cell array may include a plurality of memory cell strings ST. Each memory cell string ST may include at least one drain select transistor DST, a plurality of memory cells M, and at least one source select transistor SST. The plurality of memory cells M may be connected in series between the drain select transistor DST and the source select transistor SST. The drain select transistor DST, the plurality of memory cells M and the source select transistor SST may be connected in series by one channel structure. Memory cells M included in one memory cell string ST may be connected to different word lines.

Each memory cell string ST may be connected to a common source line CSL. Each memory cell string ST may be connected to any one bit line among a plurality of bit lines BL1 to BL4. Each memory cell string ST may be connected to a drain select line DSL1 or DSL2, a plurality of word lines WL1 to WL4, and a source select line SSL. The drain select line DSL1 or DSL2 may be used as a gate electrode of the drain select transistor DST. The plurality of word lines WL1 to WL4 may be used as gate electrodes of a plurality of memory cells.

A plurality of memory cell strings may be connected to each of the plurality of bit lines BL1 to BL4. Each of a plurality of memory cell strings connected to one bit line may be connected to a first drain select line DSL1 or a second drain select line DSL2. In an embodiment, two memory cell strings may be connected to one bit line.

Memory cells connected to one word line may constitute a plurality of physical pages. The number of physical pages included in one word line may be determined according to a number of memory cell strings commonly connected to one bit line. For example, when two memory cell strings are commonly connected to one bit line, the one word line may include two physical pages. Specifically, first to fourth memory cells M1 to M4 may constitute one physical page, and fifth to eighth memory cells M5 to M8 may constitute one physical page.

One physical page may include a plurality of logical pages. The number of logical pages included in one physical page may be determined according to a number of bits to be stored in a memory cell. For example, when the memory cell is programmed as the TLC, one physical page may include three logical pages. The three physical pages may include a Least Significant Bit (LSB) page, a Central Significant Bit (CSB) page, and a Most Significant Bit (MSB) page.

The number of each of the word lines, the memory cell strings, the bit lines, and the memory cells, which are shown in FIG. 2, is provided for convenience of description, and may be smaller or greater than the number shown in FIG. 2.

Figure 3:
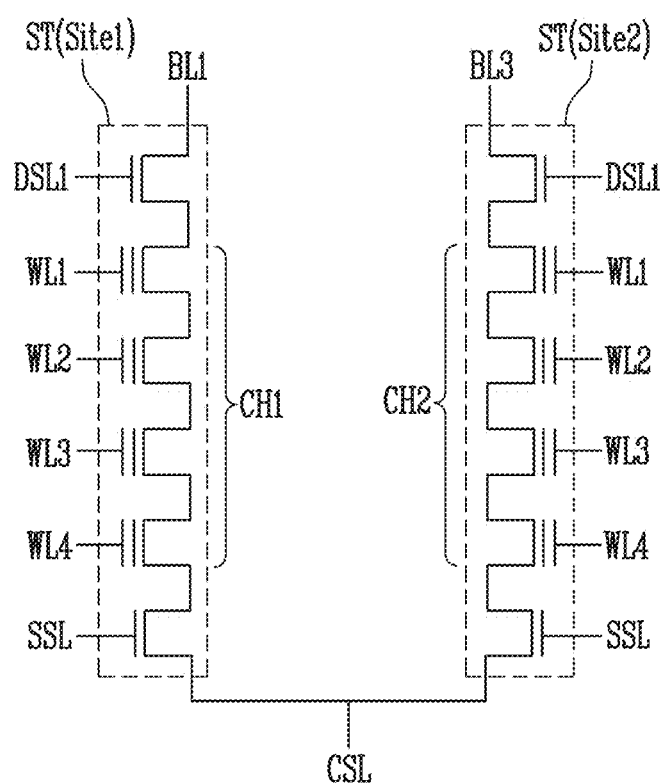
FIG. 3 is a diagram illustrating a structure of memory cell strings included in one pillar structure in accordance with an embodiment of the present disclosure.

FIG. 3 is a diagram illustrating a structure of memory cell strings included in one pillar structure in accordance with an embodiment of the present disclosure.

Referring to FIG. 3, each memory cell string ST may be connected to a bit line BL1 or BL3 and a common source line CSL. Each memory cell string ST may include a drain select transistor, a plurality of memory cells, and a source select transistor.

A memory cell string ST (Site1) of a first position and a memory cell string ST (Site2) of a second position may be memory cell strings included in one pillar structure. For example, a first pillar structure may include the memory cell string ST (Site1) of the first position and the memory cell string ST (Site2) of the second position. The pillar structure will be described in detail with reference to FIGS. 8 to 11.

In an embodiment, the memory cell string ST (Site1) of the first position may include a drain select transistor, a plurality of memory cells, and a source select transistor, which are formed in a first channel structure isolated by a cutting structure in the first pillar structure. The memory cell string ST (Site2) of the second position may include a drain select transistor, a plurality of memory cells, and a source select transistor, which are formed in a second channel structure isolated by the cutting structure in the first pillar structure.

The memory cell string ST (Site1) of the first position may include a first channel region CH1, and the memory cell string ST (Site2) of the second position may include a second channel region CH2. Each pillar structure may include channel structures isolated from each other by the cutting structure, and each of the channel structures may include a channel region.

In an embodiment, the memory cell string ST (Site1) of the first position may be connected to a first bit line BL1. The memory cell string ST (Site2) of the second position may be connected to a third bit line BL3. The memory cell string ST (Site1) of the first position and the memory cell string ST (Site2) of the second position may be commonly connected to the common source line CSL.

In another embodiment, referring to FIG. 2, the memory cell string connected to the second bit line BL2 and the first drain select line DSL1 may be the memory cell string ST (Site1) of the first position, and the memory cell string connected to the fourth bit line BL4 and the first drain select line DSL1 may be the memory cell string ST (Site2) of the second position.

The drain select transistors of the memory cell string ST (Site1) of the first position and the memory cell string ST (Site2) of the second position may be commonly connected to a first drain select line DSL1. The plurality of memory cells of the memory cell string ST (Site1) of the first position and the memory cell string ST (Site2) of the second position may both be respectively connected to a plurality of word lines WL1 to WL4. The source select transistors of the memory cell string ST (Site1) of the first position and the memory cell string ST (Site2) of the second position may be commonly connected to a source select line SSL.

Figure 4:
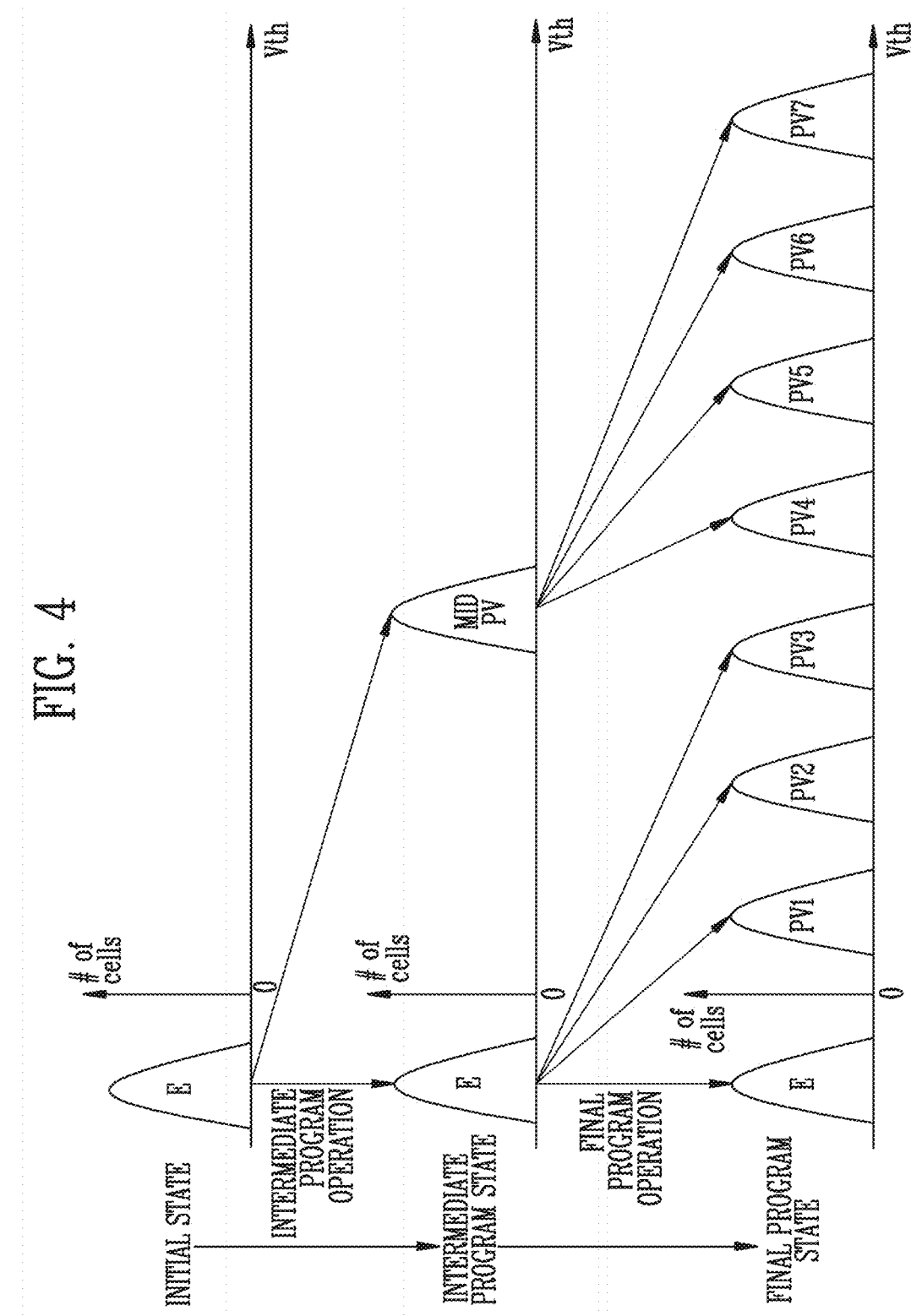
FIG. 4 is a diagram illustrating a program operation of the memory device in accordance with an embodiment of the present disclosure.

FIG. 4 is a diagram illustrating a program operation of the memory device in accordance with an embodiment of the present disclosure.

In FIG. 4, the horizontal axis of a graph represents threshold voltage Vth of memory cells, and the vertical axis of the graph represents number of memory cells (# of cells).

Referring to FIG. 4, the memory device 100 may perform a program operation on memory cells. The program operation may include an intermediate program operation and a final program operation. A threshold voltage distribution of the memory cells may be changed from an initial state to an intermediate program state based on the intermediate program operation and may be changed from the intermediate program state to a final program state based on the final program operation.

The initial state is a state in which the program operation has not been performed, and the threshold voltage distribution of the memory cells may be at an erase state E.

The intermediate program state may be a program state of memory cells on which the intermediate program operation is performed. A threshold voltage of the memory cells may be a threshold voltage corresponding to any one of the erase state E and an intermediate state MID PV through the intermediate program operation. In an embodiment, the intermediate state MID PV may be a program state equal to or lower than a fourth program state PV4 of a final program operation.

In an embodiment, a threshold voltage of memory cells having, as a target program state, a program state higher than the intermediate state MID PV may be increased to a threshold voltage corresponding to the intermediate state MID PV through the intermediate program operation. In another embodiment, a threshold voltage of memory cells having, as a target program state, a program state lower than the intermediate state MID PV may be maintained as a threshold voltage corresponding to the erase state E in the intermediate program operation. For example, when the memory cells are programmed as TLCs, the target program state higher than the intermediate state MID PV may mean any of the fourth to seventh program states PV4 to PV7.

The final program state may be a program state of memory cells on which the intermediate program operation and the final program operation are performed. A threshold voltage of the memory cells may be a threshold voltage corresponding to one of the final program states through the final program operation. In an embodiment, when the memory cells are programmed as TLCs, the final program state may mean the erase state E and first to seventh program states PV1 to PV7.

Specifically, memory cells having a threshold voltage of the erase state E in the intermediate program state may have a threshold voltage corresponding to any of the erase state E and the first to third program states PV1 to PV3 through the final program operation. Memory cells having a threshold voltage of the intermediate state MID PV in the intermediate program state may have a threshold voltage corresponding to one of the fourth to seventh program states PV4 to PV7 through the final program operation.

Each of the memory cells may have, as a target program state, any one program state, among the erase state E and the first to seventh program states PV1 to PV7, which are the final program states. The target program state may be determined according to data to be stored in each memory cell. The threshold voltage of the memory cells in the intermediate program operation may be a threshold voltage corresponding to any one of the erase state E and the intermediate state MID PV, and the threshold voltage of the memory cells in the final program operation may be a threshold voltage corresponding to any one of the erase state E and the first to seventh program states PV1 to PV7.

Figure 5:
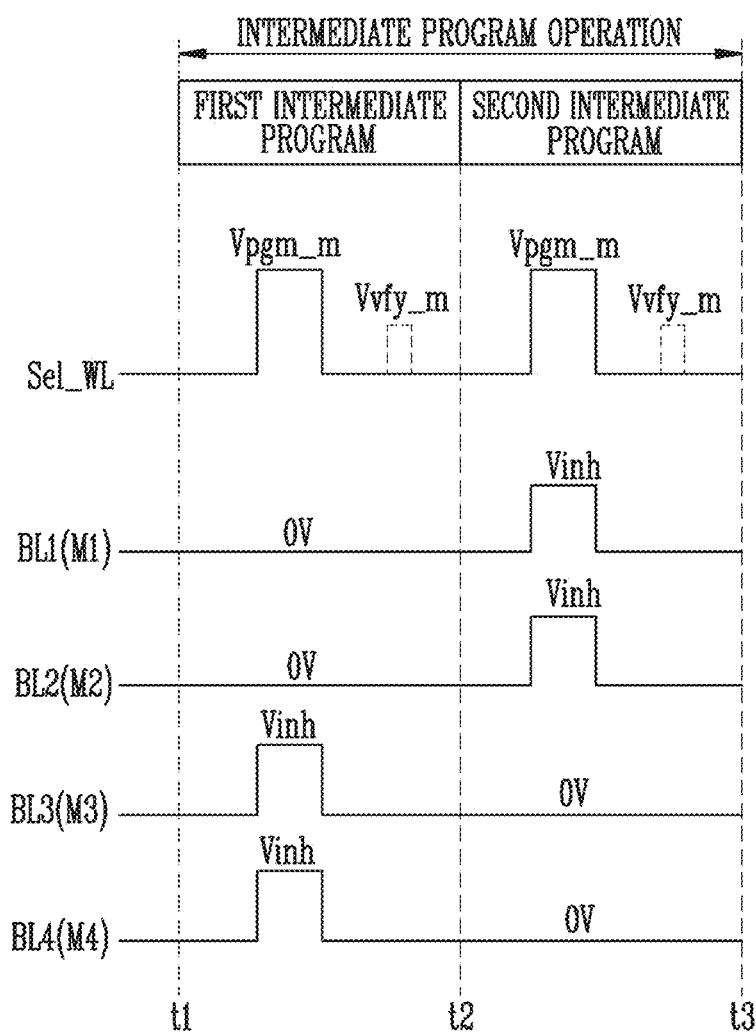
FIG. 5 is a diagram illustrating an intermediate program operation of the memory device in accordance with an embodiment of the present disclosure.

FIG. 5 is a diagram illustrating an intermediate program operation of the memory device in accordance with an embodiment of the present disclosure.

Referring to FIGS. 2, 3, and 5, the intermediate program operation may be performed on first to fourth memory cells M1 to M4 commonly connected to a selected word line Sel_WL. The first to fourth memory cells M1 to M4 may be respectively connected to first to fourth bit lines BL1 to BL4.

In an embodiment, the first memory cell M1 and the third memory cell M3 may be memory cells included in one pillar structure (first pillar structure). In addition, the second memory cell M2 and the fourth memory cell M4 may be memory cells included in another pillar structure (second pillar structure). The first pillar structure and the second pillar structure may both include a first channel structure and a second channel structure that are isolated from each other by a cutting structure. The first memory cell M1 and the second memory cell M2 may be memory cells connected to a first channel structure of the first pillar structure and a first channel structure of the second pillar structure, respectively. The third memory cell M3 and the fourth memory cell M4 may be memory cells connected to a second channel structure of the first pillar structure and a second channel structure of the second pillar structure, respectively.

In the first pillar structure, the first memory cell M1 may be included in a memory cell string ST (Site1) of a first position, and the third memory cell M3 may be included in a memory cell string ST (Site2) of a second position. In the second pillar structure, the second memory cell M2 may be included in a memory cell string ST (Site1) of the first position, and the fourth memory cell M4 may be included in a memory cell string ST (Site2) of the second position. That is, the first and second memory cells M1 and M2 may be included in the memory cell strings ST (Site1) of the first position in the first and second pillar structures, respectively, and the third and fourth memory cells M3 and M4 may be included in the memory cell strings ST (Site2) of the second position in the first and second pillar structures, respectively.

The intermediate program operation may include a first intermediate program operation and a second intermediate program operation. The first intermediate program operation may be an operation of increasing a threshold voltage of the first and second memory cells M1 and M2. The second intermediate program operation may be an operation of increasing a threshold voltage of the third and fourth memory cells M3 and M4.

In a period t1 to t2, the memory device 100 may perform the first intermediate program operation. In the period t1 to t2, the memory device 100 may apply an intermediate program voltage Vpgm_m to the selected word line Sel_WL. In the period t1 to t2, the memory device 100 may apply a pass voltage to unselected word lines. In an embodiment, the memory device 100 may apply a turn-on voltage to a selected drain select line. For example, the selected drain select line may be the first drain select line DSL1, shown in FIG. 2. The turn-on voltage may be a higher voltage than a threshold voltage of a drain select transistor connected to the selected drain select line.

In the period t1 to t2, the memory device 100 may apply a program allow voltage to a first bit line BL1 (M1) connected to first memory cells and a second bit line BL1 (M2) connected to second memory cells. In an embodiment, the program allow voltage may be a ground voltage (0V). In the period t1 to t2, the memory device 100 may apply a program inhibit voltage Vinh to a third bit line BL3 (M3) connected to third memory cells and a fourth bit line BL4 (M4) connected to fourth memory cells. In an embodiment, the program inhibit voltage may be a power voltage.

In a period t2 to t3, the memory device may perform the second intermediate program operation. In the period t2 to t3, the memory device 100 may apply the intermediate program voltage Vpgm_m to the selected word line Sel_WL. In the period t2 to t3, the memory device 100 may apply the program inhibit voltage to the first bit line BL1 (M1) connected to the first memory cells and the second bit line BL2 (M2) connected to the second memory cells. In the period t2 to t3, the memory device 100 may apply the program allow voltage to the third bit line BL3 (M3) connected to the third memory cells and the fourth bit line BL4 (M4) connected to the fourth memory cells.

In an embodiment, the memory device 100 may apply a precharge voltage having different magnitudes to a bit line connected to a memory cell included in the memory cell string of the first position and a bit line connected to a memory cell included in the memory cell string of the second position in the first intermediate program operation and the second intermediate program operation. In an embodiment, in the first intermediate program operation, the program allow voltage may be applied to the bit line connected to the memory cell included in the memory cell string of the first position, and the program inhibit voltage may be applied to the bit line connected to the memory cell included in the memory cell string of the second position. In an embodiment, in the second intermediate program operation, the program inhibit voltage may be applied to the bit line connected to the memory cell included in the memory cell string of the first position, and the program allow voltage may be applied to the bit line connected to the memory cell included in the memory cell string of the second position.

In an embodiment, the memory device 100 may apply the intermediate program voltage Vpgm_m to the selected word line Sel_WL and then may apply an intermediate verify voltage Vvfy_m to the selected word line Sel_WL in each of the first and second intermediate program operation. The memory device 100 may identify whether a threshold voltage of the first to fourth memory cells M1 to M4 has reached a threshold voltage corresponding to the intermediate state MID PV by using the intermediate verify voltage Vvfy_m. The intermediate verify voltage Vvfy_m may have the same magnitude as the threshold voltage corresponding to the intermediate state MID PV. When the threshold voltage of the first to fourth memory cells M1 to M4 does not reach the threshold voltage corresponding to the intermediate state MID PV, the memory device 100 may apply an additional program voltage to the selected word line Sel_WL. In an embodiment, the additional program voltage may be a voltage having the same magnitude as the intermediate program voltage Vpgm_m. In an embodiment, the additional program voltage may have a smaller magnitude than the intermediate program voltage Vpgm_m.

In another embodiment, the memory device 100 may apply the intermediate program voltage Vpgm_m to the selected word line Sel_WL and then might not apply the intermediate verify voltage Vvfy_m to the selected word line Sel_WL in each of the first and second intermediate program operations.

Meanwhile, each pillar structure of the memory device 100 may be isolated into a first channel structure and a second channel structure by a cutting structure. In addition, a first memory cell connected to the first channel structure and a third memory cell connected to the second channel structure may be commonly connected to one word line.

That is, since the first memory cell and the third memory cell are included in one pillar structure and are commonly connected to one word line, a threshold voltage of the third memory cell may be increased according to an increase in threshold voltage of the first memory cell in the program operation. In addition, a threshold voltage of the first memory cell may be increased according to an increase in threshold voltage of the third memory cell in the program operation. Accordingly, after each of the intermediate program operation on the first memory cell and the intermediate program operation on the third memory cell is performed, the final program operation may be performed so that a phenomenon in which a threshold voltage between the first and third memory cells changes can be reduced.

Figure 6:
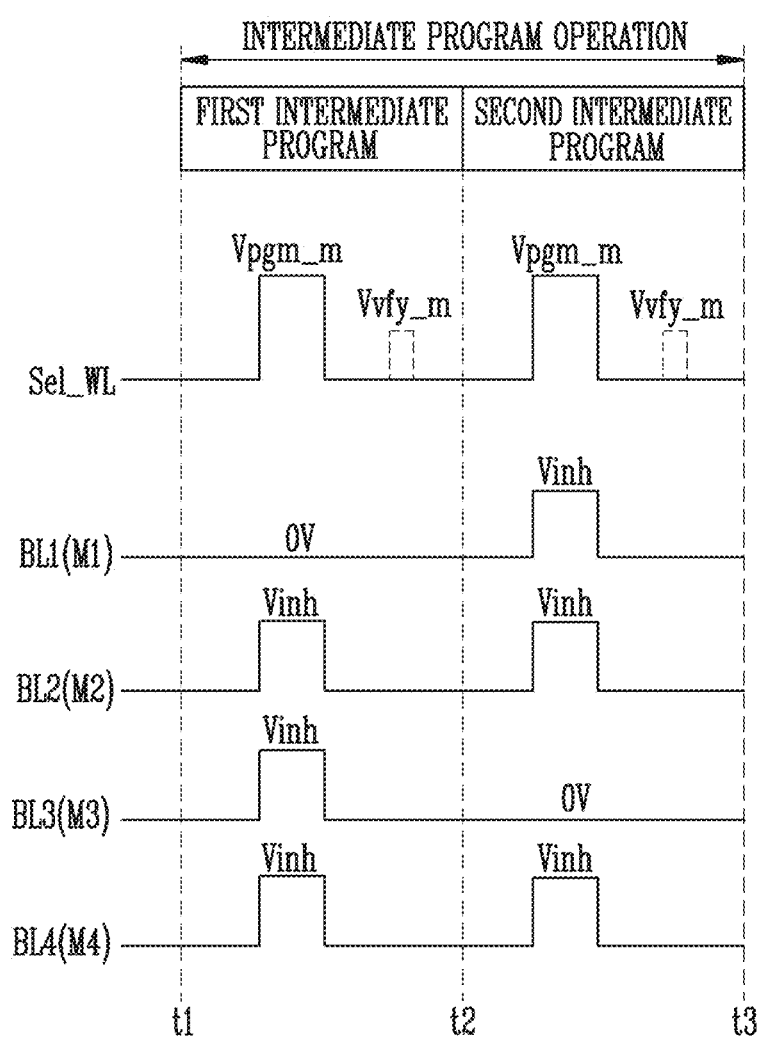
FIG. 6 is a diagram illustrating an intermediate program operation of the memory device in accordance with another embodiment of the present disclosure.

FIG. 6 is a diagram illustrating an intermediate program operation of the memory device in accordance with another embodiment of the present disclosure.

In FIG. 6, descriptions of portions overlapping with those shown in FIG. 5 will be omitted.

Referring to FIG. 6, the memory device 100 may perform the first intermediate program operation on the first and second memory cells M1 and M2 and then may perform the second intermediate program operation on the third and fourth memory cells M3 and M4. The first to fourth memory cells M1 to M4 may be commonly connected to the selected word line Sel_WL.

In a period t1 to t2, the memory device 100 may perform the first intermediate program operation on the first and second memory cells M1 and M2. In the period t1 to t2, the memory device 100 may apply the intermediate program voltage Vpgm_m to the selected word line Sel_WL. When a target program state of the first memory cell M1 is higher than the intermediate state MID_PV, the program allow voltage may be applied to the first bit line BL1 (M1) to which the first memory cell M1 is connected. In an embodiment, the target program state of the first memory cell M1 may be any of the fourth to seventh program states PV4 to PV7. In addition, when a target program state of the second memory cell M2 is lower than the intermediate state MID PV, the program inhibit voltage may be applied to the second bit line BL2 (M2) to which the second memory cell M2 is connected. In an embodiment, the target program state of the second memory cell M2 may be any of the erase state E and the first to third program states PV1 to PV3.

In a period t2 to t3, the memory device 100 may perform the second intermediate program operation on the third and fourth memory cells M3 and M4. In the period t2 to t3, the memory device 100 may apply the intermediate program voltage Vpgm_m to the selected word line Sel_WL. When a target program state of the third memory cell M3 is higher than the intermediate state MID PV, the program allow voltage may be applied to the third bit line BL3 (M3) to which the third memory cell M3 is connected. In addition, when a target program state of the fourth memory cell M4 is lower than the intermediate state MID PV, the program inhibit voltage may be applied to the fourth bit line BL4 (M4) to which the fourth memory cell M4 is connected.

Figure 7:
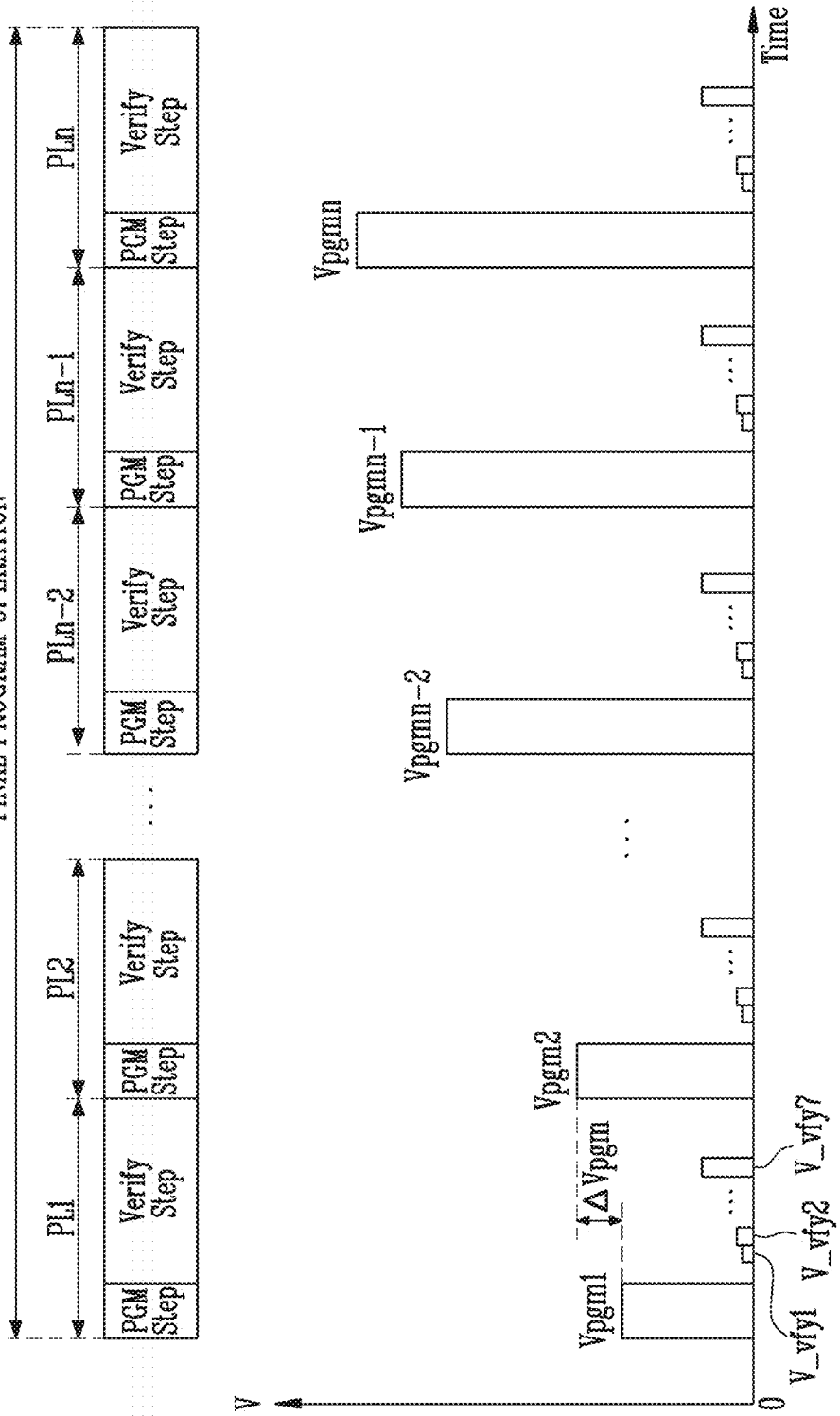
FIG. 7 is a diagram illustrating a final program operation of the memory device in accordance with another embodiment of the present disclosure.

FIG. 7 is a diagram illustrating a final program operation of the memory device in accordance with another embodiment of the present disclosure.

In FIG. 7, the horizontal axis of a graph represents time Time, and the vertical axis of the graph represents voltage V applied to a word line. The voltage V applied to the word line may include a program voltage Vpgm and a verify voltage V_vfy.

In FIG. 7, a case in which one memory cell is programmed as a TLC storing three-bit data is assumed and described. However, the scope of the present disclosure is not limited thereto, and one memory cell may be programmed to store two-or-one-bit data or store four-or-more-bit data.

Referring to FIGS. 5 and 7, the final program operation of the memory device 100 may be performed on first to fourth memory cells on which the first intermediate program operation and the second intermediate program operation are performed. The final program operation may include a plurality of program loops PL1 to PLn. The memory device 100 may perform the plurality of program loops PL1 to PLn such that a threshold voltage of selected memory cells connected to a selected word line is a threshold voltage corresponding to any one state among final program states. Each of the selected memory cells may have, as a target program state, any one state among the final program states. For example, when one memory cell is programmed as a TLC, the memory device 100 may perform the final program operation including the plurality of program loops such that the threshold voltage of the selected memory cells is a threshold voltage corresponding to one of the erase state E and the first to seventh program states PV1 to PV7.

Each of the plurality of program loops PL1 to PLn may include a program voltage apply operation PGM Step and a verify operation Verify Step.

The program voltage apply operation PGM Step may be an operation of applying a program voltage to a selected word line to which the selected memory cells are connected. For example, the memory device 100 may apply a first program voltage Vpgm1 to the selected word line to which the selected memory cells are connected in a first program loop PL1. When the first program voltage Vpgm1 is applied to the selected word line, a threshold voltage of each of the selected memory cells may be a threshold voltage corresponding to a target program state among the final program states.

The verify operation Verify Step may be an operation of applying a verify voltage to the selected word line to which the selected memory cells are connected. The verify operation Verify Step may be an operation of determining whether the threshold voltage of each of the selected memory cells is a threshold voltage corresponding to the target program state among the final program states. The verify operation Verify Step may be an operation of applying a verify voltage corresponding to the target program state of each of the selected memory cells.

In an embodiment, in the first program loop PL1, the memory device 100 may apply the first program voltage Vpgnn1 to the selected word line to which the selected memory cells are connected and then may apply first to seventh verify voltages V_vfy1 to V_vfy7. The memory device 100 may apply, to the selected word line, a verify voltage corresponding to the target program state of the selected memory cells, among the first to seventh verify voltages V_vfy1 to V_vfy7. For example, the memory device 100 may perform a verify operation on memory cells of which the target program state is the first program state. As each of the verify voltages V_vfy1 to V_vfy7 approaches from the first verify voltage V_vfy1 to the seventh verify voltage V_vfy7, a magnitude of each of the verify voltages V_vfy1 to V_vfy7 may increase. Specifically, the magnitude of each of the verify voltages V_vfy1 to V_vfy7 may be smallest with respect to the first verify voltage V_vfy1 and may be largest with respect to the seventh verify voltage V_vfy7. The number of verify voltages is not limited to this embodiment.

It may be determined that a threshold voltage of memory cells of which verify operation Verify Step passes by each of the verify voltages V_vfy1 to V_vfy7 is a threshold voltage corresponding to the target program state. The program inhibit voltage may be applied to a bit line connected to the memory cells of which verify operation Verify Step passes in a second program loop PL2.

It may be determined that the threshold voltage of the memory cells of which verify operation Verify Step fails by each of the verify voltages V_vfy1 to V_vfy7 is not the threshold voltage corresponding to the target program state. Memory cells of which verify operation Verify Step fails may perform the second program loop PL2. The program allow voltage may be applied to a bit line connected to the memory cells of which verify operation Verify Step fails in the second program loop PL2.

In the second program loop PL2, the memory device 100 may apply a second program voltage Vpgm2, a voltage level that is higher by a unit voltage ΔVpgm than the first program voltage Vpgnn1, to the selected word line to which the selected memory cells are connected. After that, the memory device 100 may perform a verify operation Verify Step of the second program loop PL2, which is identical to the verify operation Verify Step of the first program loop PL1.

After that, the memory device 100 may perform a next program loop a predetermined number of times, identically to the second program loop PL2.

In an embodiment, when the program operation is not completed within the predetermined number of program loops, the program operation may fail. When the program operation is completed within the program loops of the predetermined number of times, the program operation may pass. Whether the program operation is completed may be determined based on whether all verify operations Verify Step on the selected memory cells have passed. When all the verify operations Verify Step on the selected memory cells pass, any next program loop might not be performed.

In an embodiment, the program voltage may be determined according to an Incremental Step Pulse Programming (ISPP) method. A level of the program voltage may increase or decrease in a stepwise manner as the program loops PL1 to PLn are repeated. In various manners, the memory controller 200 may control a number of times program voltages used in each program loop are applied, a voltage level of the program voltages, a time for which the program voltages are applied, and the like.

Figure 8:
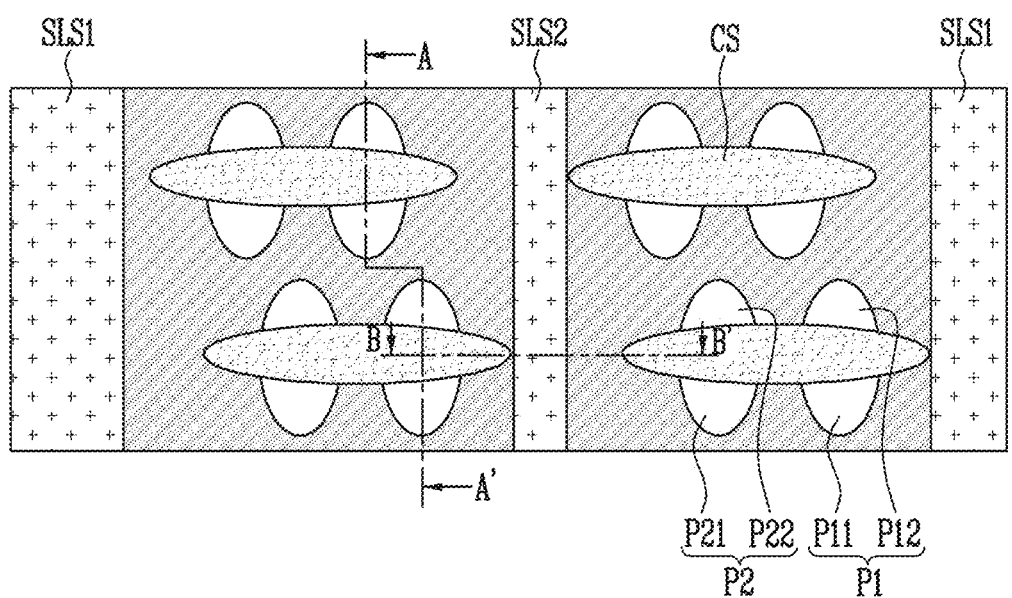
FIG. 8 is a view illustrating a structure of the memory device in accordance with an embodiment of the present disclosure.

FIG. 8 is a view illustrating a structure of the memory device in accordance with an embodiment of the present disclosure.

Figure 9:
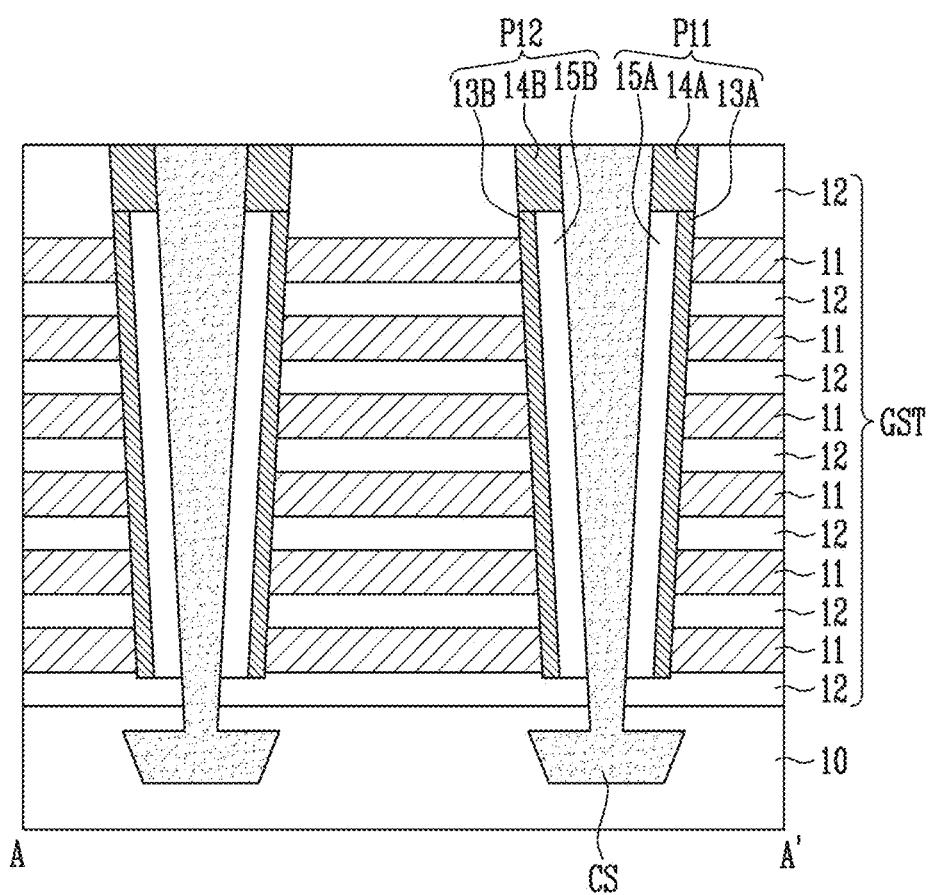
FIG. 9 is a view illustrating a pillar structure included in the memory device.

FIG. 9 is a view illustrating a pillar structure included in the memory device.

Figure 10:
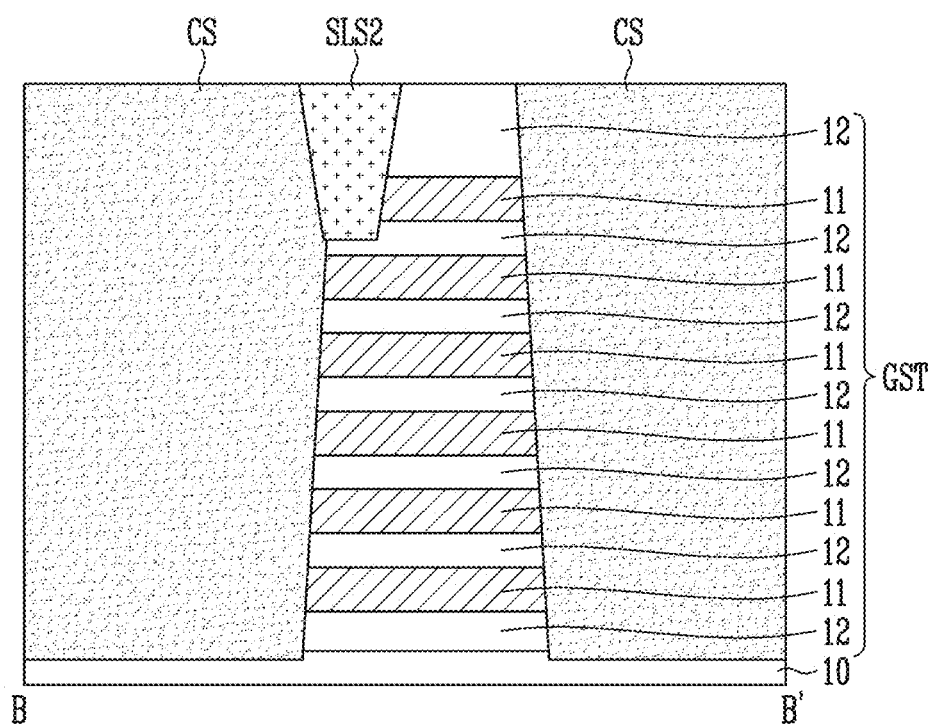
FIG. 10 is a view illustrating a slit structure included in the memory device.

FIG. 10 is a view illustrating a slit structure included in the memory device.

Referring to FIGS. 8 to 10, the memory device 100 may include a substrate 10, a gate stack structure GST, pillar structures P1 and P2, a cutting structure CS, a first slit structure SLS1, and a second slit structure SLS2.

The gate stack structure GST may include conductive layers 11 and insulating layers 12, which are alternately stacked. The conductive layer 11 may be a gate electrode of a drain select transistor, a memory cell, a source select transistor, or the like. The conductive layer 11 may include a conductive material. The insulating layer 12 may be a layer for insulating the stacked conductive layers 11 from each other. The gate stack structure GST may be stacked on the substrate 10. The substrate 10 may include a source region doped with an impurity.

The pillar structures P1 and P2 may vertically penetrate the gate stack structure GST. Each of the pillar structures P1 and P2 may include a first channel structure P11 or P21 and a second channel structure P12 or P22. The first channel structure P11 or P21 and the second channel structure P12 or P22 may be structures isolated from each other by the cutting structure CS. The first channel structure P11 or P21 and the second channel structure P12 or P22 may be structures that are symmetrical to each other with respect to the cutting structure CS.

A drain select transistor, a plurality of memory cells, and a source select transistor may be sequentially formed where the first channel structure P11 or P21 and the conductive layers 11 intersect each other. In addition, a drain select transistor, a plurality of memory cells, and a source select transistor may be sequentially formed where the second channel structure P12 or P22 and the conductive layers 11 intersect each other.

A drain select transistor, a plurality of memory cells, and a source select transistor may be vertically stacked on the substrate 10. In an embodiment, the drain select transistor may be formed in a conductive layer 11 located at an uppermost portion among the conductive layers 11 included in the gate stack structure GST. In an embodiment, the source select transistor may be formed in a conductive layer 11 located at a lowermost portion among the conductive layers 11 included in the gate stack structure GST. The conductive layer 11 located at the lowermost portion may be a conductive layer most adjacent to the substrate 10.

In an embodiment, the plurality of memory cells may be formed in conductive layers between the conductive layer in which the drain select transistor is formed and the conductive layer in which the source select transistor is formed. A first memory cell and a second memory cell, which are formed in a conductive layer 11 having the same height with respect to the cutting structure CS, among the plurality of memory cells, may be individually driven.

The first channel structure P11 and P21 may include a first channel layer 15A. The first channel layer 15A may be a region in which a channel of the drain select transistor, the plurality of memory cells, and the source select transistor is formed. In an embodiment, the first channel layer 15A may include a semiconductor material, such as silicon or germanium. In an embodiment, the first channel region CH1, shown in FIG. 3, may be formed in the first channel layer 15A.

The first channel structure P11 or P21 may include a first conductive pad 14A. The first conductive pad 14A may be connected to the first channel layer 15A. The first conductive pad 14A may include a conductive material.

The first channel structure P11 or P21 may further include a first memory layer 13A. The first memory layer 13A may include a floating gate, a charge trap material, and the like.

The second channel structure P12 or P22 may have the same structure as the first channel structure P11 or P21. The second channel structure P12 or P22 may include a second channel layer 15B. In an embodiment, the second channel region CH2, shown in FIG. 3, may be formed in the second channel layer 15B. The second channel structure P12 or P22 may include a second conductive pad 14B and a second memory layer 13B.

The cutting structure CS may penetrate the gate stack structure GST and the pillar structures P1 and P2. The cutting structure CS may expand to the substrate 10. The cutting structure CS may simultaneously penetrate the pillar structures P1 and P2. In an embodiment, the cutting structure CS may traverse a first pillar structure P1 and a second pillar structure P2, which are consecutively arranged. In an embodiment, the cutting structure CS may penetrate one or three or more pillar structures while traversing the one or three or more pillar structures. Each pillar structure may be isolated into the first channel structure P11 or P21 and the second channel structure P12 or P22 by the cutting structure CS. The cutting structure CS may include an insulating material. The plurality of cutting structures CS may be provided between a pair of first slit structures SLS1.

In a cross-sectional view, the cutting structure CS may have a different width changes at different heights. The width of the cutting structure CS may be widest at the top and narrowest at the bottom.

The first slit structure SLS1 may penetrate the gate stack structure GST. The first slit structure SLS1 may include an insulating material.

The second slit structure SLS2 may penetrate the gate stack structure GST in a shallow depth. In an embodiment, the second slit structure SLS2 may penetrate at least one uppermost conductive layer 11. In an embodiment, when the second slit structure SLS2 penetrates the uppermost conductive layer 11, drain select transistors formed in the uppermost conductive layer 11 may be respectively connected to different drain select lines.

The second slit structure SLS2 may be located between a pair of first slit structures SLS1. The second slit structure SLS2 may extend in a direction intersecting the cutting structure CS. In an embodiment, the cutting structures CS may be asymmetrically or symmetrically arranged with respect to the second slit structure SLS2. The second slit structure SLS2 may be in contact with at least one cutting structure CS. The pillar structures P1 and P2 may be located between the first slit structure SLS1 and the second slit structure SLS2.

Figure 11:
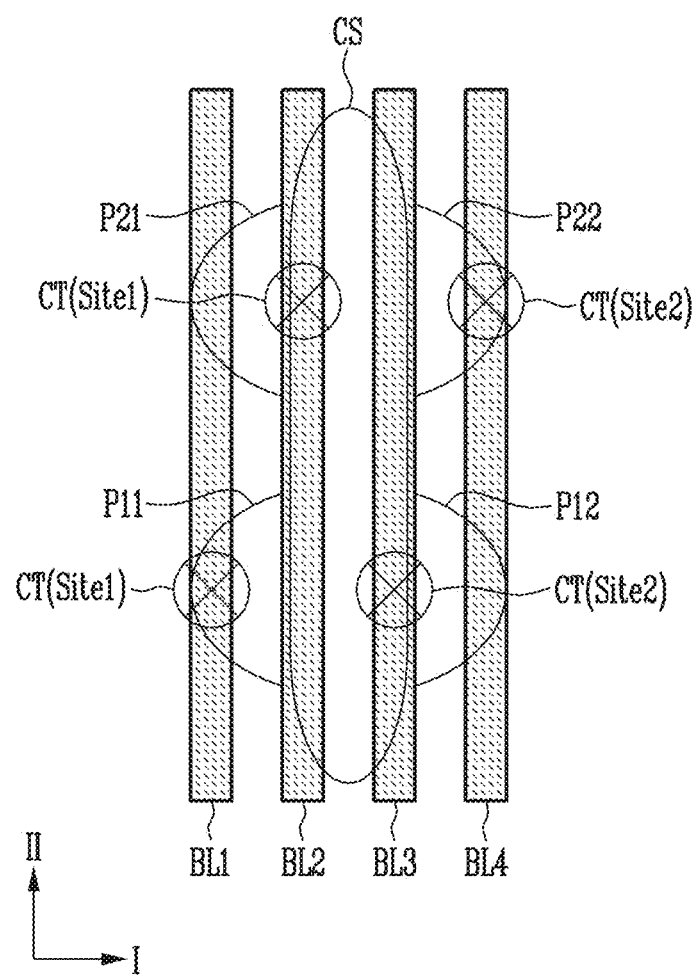
FIG. 11 is a view illustrating bit lines connected to pillar structures.

FIG. 11 is a view illustrating bit lines connected to the pillar structures.

FIG. 11 will be described with reference to FIGS. 8 to 10.

Referring to FIG. 11, bit lines BL1 to BL4 may be arranged in a direction intersecting the first slit structure SLS1 and the second slit structure SLS2. The bit lines BL1 to BL4 may be parallel to the cutting structure CS.

Each channel structure included in each pillar structure may be connected to a contact plug CT.

A first bit line BL1 may be connected to a first channel structure P11 of the first pillar structure P1 through a contact plug CT. A third bit line BL3 may be connected to the second channel structure P12 of the first pillar structure P1 through a contact plug CT.

A second bit line BL2 may be connected to the first channel structure P21 of the second pillar structure P2 through a contact plug CT. A fourth bit line BL4 may be connected to the second channel structure P22 of the second pillar structure P2 through a contact plug CT.

The first channel structure P11 and P21 and the second channel structure P12 and P22, which are included in one pillar structure, may be connected to different bit lines through contact plugs CT. In an embodiment, a drain select transistor, a plurality of memory cells, and a source select transistor may be connected to a bit line through a contact plug CT.

Contact plugs connected to one pillar structure may be connected to different bit lines. In an embodiment, each of the first pillar structure P1 and the second pillar structure P2 may include a contact plug CT (Site1) of a first position and a contact plug CT (Site2) of a second position.

The first channel structures P11 and P21 may be connected to the contact plug CT (Site1) of the first position. In an embodiment, a memory cell string of the first position may be connected to the first bit line BL1 or the third bit line BL3 through the contact plug CT (Site1) of the first position. The second channel structures P12 and P22 may be connected to the contact plugs CT (Site2) of the second position. In an embodiment, a memory cell string of the second position may be connected to the second bit line BL2 or the fourth bit line BL4 through the contact plug CT (Site2) of the second position.

Specifically, in a plan view, the contact plug CT (Site1) of the first position of the first channel structure P11 may be a contact plug located at a left side of the second bit line BL2. Meanwhile, the contact plug CT (Site2) of the second position of the second channel structure P12 may be a contact plug located at a right side of the second bit line BL2. Similarly, the contact plug CT (Site1) of the first position of the first channel structure P21 may be a contact plug located at a left side of the third bit line BL3, and the contact plug CT (Site2) of the second position of the second channel structure P22 may be a contact plug located at a right side of the third bit line BL3.

In an embodiment, one pillar structure may be connected to two or more bit lines, and each bit line may be connected to a plurality of cell strings.

FIG. 12 is a flowchart illustrating a program operation of the memory device in accordance with an embodiment of the present disclosure.

Referring to FIG. 12, in step S1301, the memory device 100 may apply an intermediate program voltage to a word line commonly connected to a first memory cell connected to a first channel structure and a second memory cell connected to a second channel structure. The first channel structure and the second channel structure may be formed by using a cutting structure in a pillar structure, thereby isolating two channel structures.

In step S1303, the memory device 100 may apply a program inhibit voltage to a bit line connected to the second memory cell. In an embodiment, the memory device 100 may apply a program allow voltage to a bit line connected to the first memory cell.

In step S1305, the memory device 100 may apply the intermediate program voltage to the word line commonly connected to the first memory cell and the second memory cell.

In step S1307, the memory device 100 may apply the program inhibit voltage to the bit line connected to the first memory cell. In an embodiment, the memory device 100 may apply the program allow voltage to the bit line connected to the second memory cell.

In step S1309, the memory device 100 may perform a final program operation on the first memory cell and the second memory cell. In an embodiment, a threshold voltage of the first memory cell and the second memory cell may be a threshold voltage corresponding to any one state, among final program states, through the final program operation. Each of the first memory cell and the second memory cell may have, as a target program state, any one state, among the final program states.

In accordance with the present disclosure, a memory device and an operating method thereof can reduce a phenomenon in which a threshold voltage of adjacent memory cells changes in a program operation.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made based on the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made based on the technological scope of the present disclosure in addition to the embodiments disclosed herein.

What is claimed is:

1. A memory device comprising:
   a memory cell array including:
      a gate stack structure in which conductive layers and insulating layers are alternately stacked;
      a first channel structure and a second channel structure, which vertically penetrate the gate stack structure and are isolated from each other by a cutting structure; and
      a first memory cell connected to the first channel structure, and a second memory cell connected to the second channel structure;
   a peripheral circuit configured to perform a program operation of storing data in the first and second memory cells commonly connected to a word line; and
   a program operation controller configured to control the peripheral circuit to perform the program operation, the program operation including:
      an intermediate program operation performed on the first memory cell and then on the second memory cell; and
      a final program operation performed to increase a threshold voltage of the first and second memory cells to a threshold voltage corresponding to a target program state, wherein the intermediate program operation is performed to increase the threshold voltage of the first and second memory cells to a threshold voltage corresponding to any one of an erase state and an intermediate state.

2. The memory device of claim 1, wherein the program operation controller controls the peripheral circuit to apply an intermediate program voltage to the word line in the intermediate program operation.

3. The memory device of claim 1, wherein, while the intermediate program operation on the first memory cell is being performed, the program operation controller controls the peripheral circuit to apply a program inhibit voltage to a bit line connected to the second memory cell.

4. The memory device of claim 1, wherein, while the intermediate program operation on the second memory cell is being performed, the program operation controller controls the peripheral circuit to apply a program inhibit voltage to a bit line connected to the first memory cell.

5. The memory device of claim 1, wherein, in the intermediate program operation, the program operation controller controls the peripheral circuit to apply a program inhibit voltage to a bit line connected to a memory cell having the target program state that is lower than the intermediate state, among the first and second memory cells.

6. The memory device of claim 1, wherein, in the intermediate program operation, the program operation controller controls the peripheral circuit to apply a program allow voltage to a bit line connected to a memory cell having the target program state that is higher than the intermediate state, among the first and second memory cells.

7. The memory device of claim 1, wherein the final program operation includes a plurality of program loops, and wherein each of the plurality of program loops includes a program voltage apply operation of increasing the threshold voltage of the first and second memory cells by using a program voltage, and a verify operation of identifying the threshold voltage of the first and second memory cells by using a verify voltage.

8. The memory device of claim 7, wherein a magnitude of the program voltage increases by a magnitude of a step voltage based on a number of times the plurality of program loops are performed.

9. A method of operating a memory device, the method comprising:
   performing an intermediate program operation on a first memory cell connected to a first channel structure selected from the first channel structure and a second channel structure, which vertically penetrate a gate stack structure and are isolated from each other by a cutting structure, wherein the gate stack structure includes conductive layers and insulating layers that are alternately stacked;
   performing the intermediate program operation on a second memory cell that is connected to the second channel structure and is commonly connected to a word line connected to the first memory cell; and
   performing a final program operation to increase a threshold voltage of the first and second memory cells to a threshold voltage corresponding to a target program state,
   wherein the intermediate program operation is performed to increase the threshold voltage of the first and second memory cells to a threshold voltage corresponding to any one of an erase state and an intermediate state.

10. The method of claim 9, wherein, while the intermediate program operation on the first memory cell is being performed, a program inhibit voltage is applied to a bit line connected to the second memory cell.

11. The method of claim 9, wherein, while the intermediate program operation on the second memory cell is being performed, a program inhibit voltage is applied to a bit line connected to the first memory cell.

12. The method of claim 9, wherein, while the intermediate program operation on each of the first and second memory cells is being performed, a program inhibit voltage is applied to a bit line connected to a memory cell having the target program state that is lower than the intermediate state, among the first and second memory cells.

13. The method of claim 9, wherein, while the intermediate program operation on each of the first and second memory cells is being performed, a program allow voltage is applied to a bit line connected to a memory cell having the target program state that is higher than the intermediate state, among the first and second memory cells.

14. The method of claim 9, wherein the final program operation includes a plurality of program loops, and wherein each of the plurality of program loops includes a program voltage apply operation of increasing the threshold voltage of the first and second memory cells by using a program voltage, and a verify operation of identifying the threshold voltage of the first and second memory cells by using a verify voltage.

15. The method of claim 9, wherein the final program operation is performed using an Incremental Step Pulse Program (ISPP) method.

16. A memory device comprising:
   a memory cell array including a pillar structure including a first memory cell included in a first channel region vertically formed on a substrate and a second memory cell included in a second channel region formed in parallel to the first channel region;

an address decoder configured to perform an intermediate program operation of providing a first intermediate program voltage to a word line commonly connected to the first memory cell and the second memory cell and then providing a second intermediate program voltage to the word line and configured to perform a final program operation of providing a program voltage to the word line; and a page buffer configured to provide a first precharge voltage to a bit line connected to the first memory cell and a second precharge voltage to a bit line connected to the second memory cell, wherein, when each of the first and second intermediate program voltages are provided to the word line, the first precharge voltage and the second precharge voltage have different magnitudes.

17. The memory device of claim 16, wherein, when the first intermediate program voltage is provided to the word line, the first precharge voltage is a program allow voltage, and the second precharge voltage is a program inhibit voltage.

18. The memory device of claim 16, wherein, when the second intermediate program voltage is provided to the word line, the first precharge voltage is a program inhibit voltage, and the second precharge voltage is a program allow voltage.

19. The memory device of claim 16, wherein the final program operation is an operation of increasing a threshold voltage of the first and second memory cells to a threshold voltage corresponding to a target program state.

20. The memory device of claim 16, wherein the intermediate program operation is performed such that a threshold voltage of the first and second memory cells is a threshold voltage corresponding to any one of an erase state and an intermediate state.

* * * * *